United States Patent [19]

Hattori

[11] Patent Number: 5,075,717
[45] Date of Patent: Dec. 24, 1991

[54] IMAGE RECORDING APPARATUS
[75] Inventor: Tomoaki Hattori, Nogoya, Japan
[73] Assignee: Brother Kogyo Kabushiki Kaisha, Japan
[21] Appl. No.: 545,581
[22] Filed: Jun. 29, 1990
[30] Foreign Application Priority Data Jul. 31, 1989 [JP] Japan .................................. 1-199045

[51] Int. Cl.$^5$ ............................................. G03B 27/32
[52] U.S. Cl. ....................................... 355/27; 355/77; 355/50
[58] Field of Search .................... 355/27, 28, 106, 235, 355/243, 77

[56] References Cited

U.S. PATENT DOCUMENTS

| | | | |
|---|---|---|---|
| 3,812,505 | 5/1974 | Elliott | 355/235 |
| 4,959,681 | 9/1990 | Ogura | 355/27 |
| 4,984,011 | 1/1991 | Sakakibara et al. | 355/27 |

Primary Examiner—L. T. Hix
Assistant Examiner—D. Rutledge
Attorney, Agent, or Firm—Oliff & Berridge

[57] ABSTRACT

An image recording apparatus has an exposing device in which the light from a light source is irradiated to an original text and a photosensitive, pressure-sensitive paper is exposed to the light from the text in correspondence to the image of the text. The image recording apparatus is designed so that the light source and the photosensitive, pressure-sensitive paper have a relative movement by means of a movement device, with the moving speed being varied by means of a moving speed control device. The duration of exposure of the photosensitive, pressure-sensitive paper by the exposing device is varied in response to the moving speed, whereby the level of exposure can be varied. Accordingly, this image recording apparatus, which is simple in structure, accomplishes a variable exposure level for the photosensitive, pressure-sensitive paper without the need of varying the light output of the light source and regardless of the type of the light source.

20 Claims, 5 Drawing Sheets

IMAGE RECORDING APPARATUS

BACKGROUND OF THE INVENTION

1. Field of the Invention

The present invention relates to an image recording apparatus based on the exposure of a photosensitive recording medium to the light, and particularly to the adjustment of the level of exposure.

2. Description of the Related Art

An image recording apparatus of this type incorporates a light exposing device which irradiates the light from a light source to the original text and exposes the photosensitive medium to the light which has been subjected to the influence of the original text Conventionally, an incandescent lamp, such as a halogen lamp as disclosed in U.S. Pat. No. 4,806,984, or a fluorescent lamp is used for the light source and the light output of the light source is varied for the adjustment of the level of exposure thereby to adjust the contrast of the recorded image or the like.

However, in case an incandescent lamp is used for the light source, a change in the light output creates a variation in the hue of light, resulting in deviation from the range of wavelength sensitivity of the photosensitive medium. The photosensitive medium has its sensitive wavelength range determined from the composition of the medium, and the deviation from the wavelength range can cause such impropriety as the collapse of color balance. Although a fluorescent light source retains the wavelength even if the light output is changed, the adjustment of its light output necessitates a complex circuitry, resulting in an expensive apparatus.

SUMMARY OF THE INVENTION

It is an object of the present invention to provide an image recording apparatus capable of easily adjusting the level of exposure.

In order to achieve the above object, the present invention resides, in one aspect, in an image recording apparatus having an exposing device with a light source for exposing a photosensitive medium and characterized in the provision of: (a) a relative moving device which produces relative movement between the light source and the photosensitive medium, and (b) a movement control device which varies the moving speed of the moving device in at least two steps of variation.

The moving speed of the moving device may be varied in multiple steps, i.e., three steps or more, or may be varied continuously. The moving speed may be varied in response to the operator's instruction of the exposure level and moving speed, or may be varied in response to the result of automatic comparison between a specified preset concentration and an actual concentration of a recorded image.

A variation in the relative moving speed between the light source and the photosensitive medium results in a variation of the exposure time of the photosensitive medium, whereby the level of exposure can be varied without changing the light output of the light source. The relative moving speed between the light source and the photosensitive medium is varied thereby to produce an intended level of exposure. Consequently, the photosensitive medium is exposed to light of a constant wavelength invariably. It is relatively easy to make a relative movement between the light source and the photosensitive medium and vary the relative moving speed, whereby an image recording apparatus which is simple in structure and capable of adjusting the level of exposure can be accomplished.

These and other objects and novel features of the present invention will become more apparent from the following detailed description taken in conjunction with the accompanying drawings. The drawings are provided for illustrative purpose, and the invention is not limited by the drawings.

BRIEF DESCRIPTION OF THE DRAWINGS

Among the accompanying drawings.

DESCRIPTION OF THE PREFERRED EMBODIMENT

An embodiment of the present invention will be described in detail with reference to the drawings.

Figure 1:
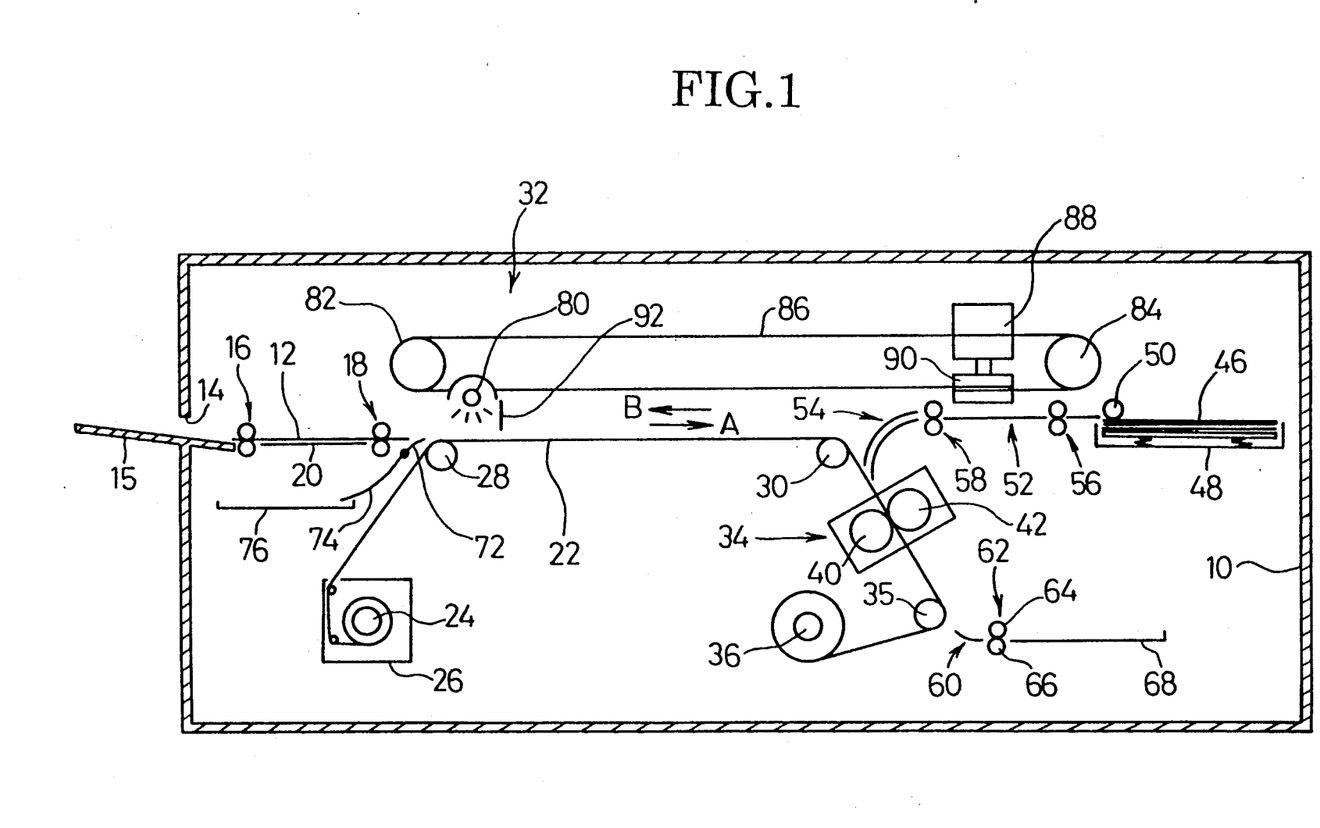
FIG. 1 is a front cross-sectional view of an image recording apparatus embodying the present invention.

FIG. 1 is a front sectional view showing the photosensitive, pressure-sensitive medium using copy machine according to an embodiment of this invention, in which indicated by 10 is a housing. The housing 10 is provided, in its one side wall in the longitudinal direction, with a text insert port 14 and a text insert tray 15 for entering an original text 12 into the housing 10. The entered original text 12 is transported by feed rollers 16 and 18 while being guided by a guide 20, and it is placed on a photosensitive, pressure-sensitive paper 22. The paper 22 includes numerous micro-capsules containing photosensitive resin, dye-precursor and polymerization initiator which harden by being exposed to the light. Three types of microcapsules are used for recording color images. These are micro-capsule C which hardens by being exposed to the natural light of red, micro-capsule M which hardens by being exposed to the natural light of green, and micro-capsule Y which hardens by being exposed to the natural light of blue. These micro-capsules C, M and Y react with the natural light of corresponding hues and harden in the exposure process, and micro-capsules which have not hardened are broken in the development process so that the image of text is recorded in colors which correspond to the hues of light that have hardened the micro-capsules, i.e., in the colors of the original text. The photosensitive, pressure-sensitive paper 22 is accommodated in a casing 26 by being wound to form a roll on a supply reel 24, and it is transported to the location below the exposure device 32 by being guided by guide rollers 28 and 30, and it is further transported through a pressure development device 34 and a guide roller 35, and wound on a take-up reel 36. The supply reel 24 and the take-up reel 36 are driven by a paper feed motor 38 (refer to FIG. 2) through individual friction clutches so that the same amount of the paper 22 is supplied and taken up.

The pressure development device 34 has a pair of pressure rollers 40 and 42. The pressure rollers 40 and 42 are displaced such that they rotate around axes that are at right angles with the transportation direction of the paper 22. Among the pressure rollers, one roller 40 is disposed at a fixed position, and the other roller 42 is disposed movably to come close to or go away from the roller 40. The pressure roller 42 is moved by a pressure motor 44 (refer to FIG. 2), and it is spaced out off the pressure roller 40 when the pressure is not applied, while it is brought in contact with the pressure roller 40 when the pressure is applied so that the overlapping photosensitive, pressure-sensitive paper 22 and a developing paper 46 are transported while being pressed. The developing paper 46 is accommodated in a developing paper case 48 which is provided on the downstream side in the exposing feed direction of the photosensitive, pressure-sensitive paper 22. The developing paper 46 is a sheet of material, with a coloring agent which reacts with the contents of microcapsules coated on the photosensitive, pressure-sensitive paper 22. The developing paper 46 is pulled out of the case 48 by a supply roller 50, fed by feed rollers 56 and 58 while being guided by guides 52 and 54, and supplied to the pressure development device 34 by being overlapped on the photosensitive, pressure-sensitive paper 22 which has been exposed to the light. After the development process, the developing paper 46 is taken off the photosensitive, pressure-sensitive paper 22 being guided by a guide 60, and it is sent to a heating device 62. The heating device 62 is provided with a heating roller 64 and a backup roller 66, and after the heat-fixing process, the developing paper 46 is evacuated to a paper evacuation tray 68. A gate 72 is provided between the roller 18 which transports the original text 12 to the overlapping position with the photosensitive, pressure-sensitive paper 22 and the guide roller 28 which leads the paper 22 to the location below the exposure device 32. The gate 72 functions to lead the original text 12 which is transported by the feed roller 18 to the location over the photosensitive, pressure-sensitive paper 22, and also to remove the text 12 off the photosensitive, pressure-sensitive paper 22 and lead it to a text evacuation tray 76 by way of a guide 74 when the paper 22 is reversely wound on the supply reel 24.

Next, the exposing device 32 will be explained. The exposing device 32 has a halogen lamp 80 for its light source. The halogen lamp 80 is attached to a wire 86 which runs between a pair of pulleys 82 and 84. The wire 86 is wound around a drive pulley 90 which is fixed to the output shaft of a pulse motor 88, so that when the drive pulley 90 is rotated by the pulse motor 88, the halogen lamp 80 on the wire 86 is moved reciprocally in the direction parallel to the feed direction of the photosensitive, pressure-sensitive paper 22. A reflector 92 is placed on the downstream side in the exposing feed direction (right-hand side in the figure) of the halogen lamp 80 so that the unexposed portion of the paper 22 is not exposed to the light.

Figure 2:
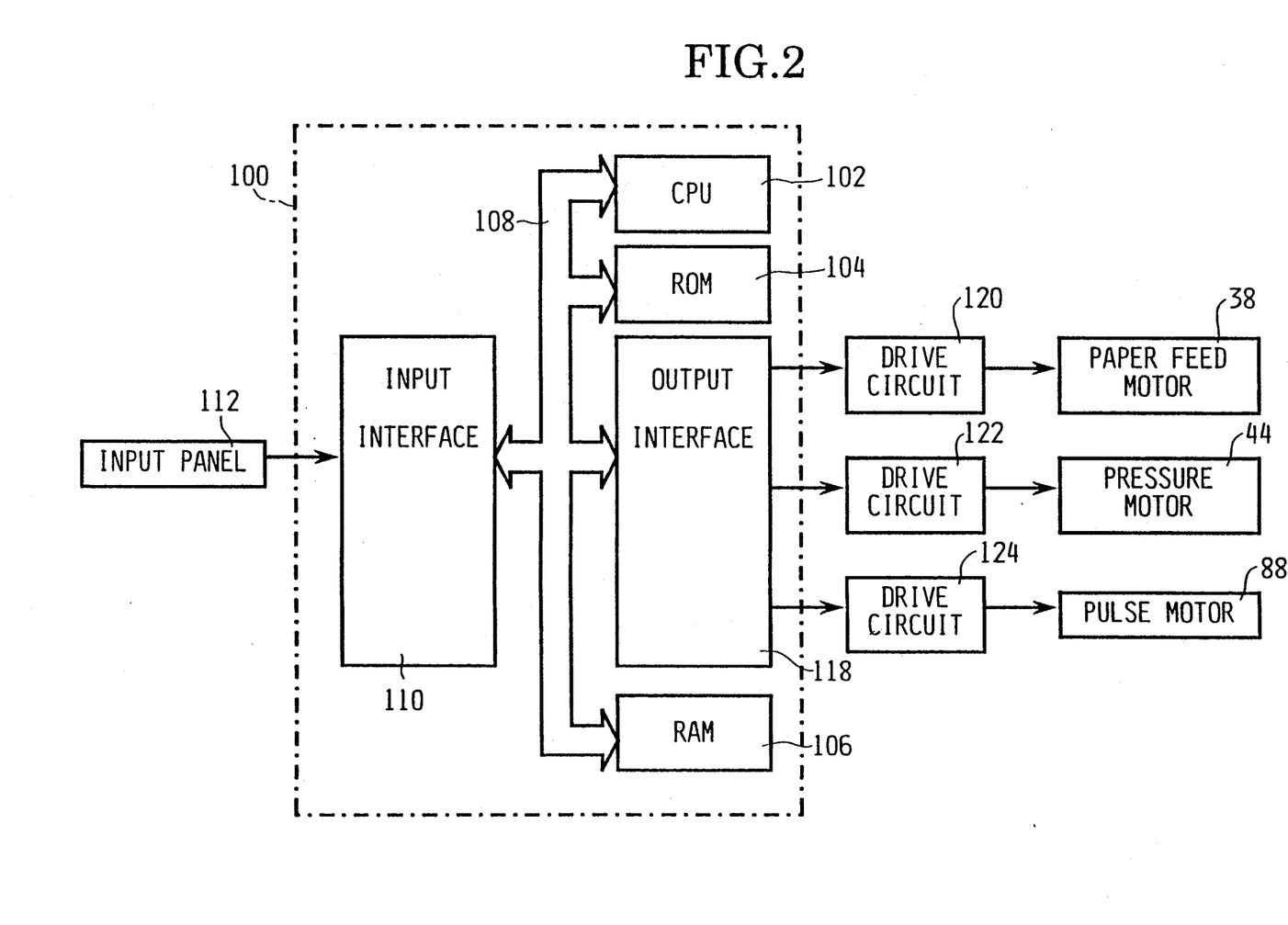
FIG. 2 is a block diagram showing the arrangement of the control device which controls the image recording apparatus.
Figure 3:
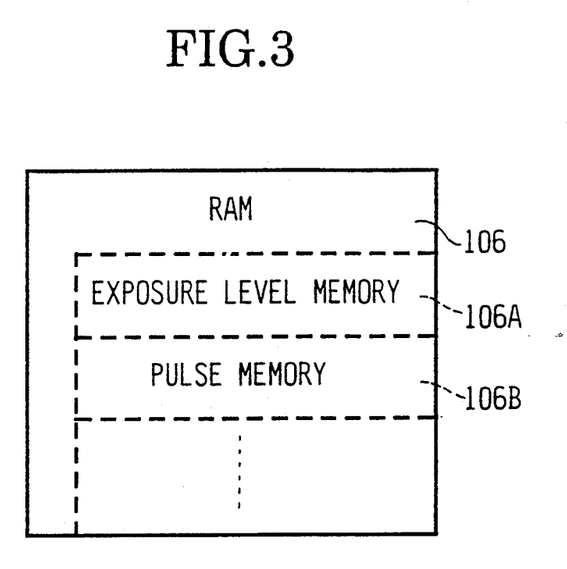
FIG. 3 is a diagram schematically showing the memory area arrangement of the RAM for the computer which constitutes the principal portion of the control device.

This image recording apparatus is controlled by a controller 100 shown in FIG. 2. The controller 100 is mainly constituted by a microcomputer which comprises a CPU 102, a ROM 104, a RAM 106 and a bus 108 which interconnects these components. The bus 108 is connected with an input interface 110, to which an input panel 112, etc. are connected. The input panel 112 is used by the operator to enter such copy data as the level of exposure and the number of copies. The bus 108 is further connected with an output interface 118, which is connected to the paper feed motor 38, the pressure motor 44, the pulse motor 88, etc. through respective drive circuits 120, 122 and 124. The RAM 106 has a memory area for the exposure level, a memory area for holding a pulse rate to be fed to the pulse motor 88 and a working memory area, as shown in FIG. 3. The ROM 104 stores various programs necessary for the copy operations such as a program for controlling the moving speed of the halogen lamp 80 as shown by the flowchart of FIG. 4.

In the copy machine arranged as described above, the halogen lamp 80 is located at its home position as shown in FIG. 1 when the copy operation does not take place. In the copy operations the original text 12 facing underneath is inserted through the text insert port 14, and it is transported by the feed rollers 16 and 18 to the position at which the top of the paper coincides with the photosensitive, pressure-sensitive paper 22. After the original text 12 has been set in this manner, the halogen lamp moving speed control routine is executed. In step S1, the value of exposure level stored in the exposure level memory 106A is read out. The exposure level memory 106A stores the predetermined value when the copy machine is turned on, but the operator can change this value by entering an intended exposure level on the input panel 112, and the entered value is stored in the exposure level memory 106A. After the exposure level has been read out, in step S2 a drive pulse rate to the pulse motor 88 corresponding to the exposure level is read via a table stored in the ROM 104. Then, in S3 it is determined whether the pulse rate is equal to the value stored in the pulse memory 106B which stores the pulse rate. Thus, the ROM 104 stores a table which relates multi-step values of exposure level to the drive pulse rates necessary for attaining the respective exposure levels, and the pulse rate for an exposure level is read out of the table for comparison. In case the pulse rate stored in the pulse memory 106B is equal to the pulse rate read out of the table, the judgment in the step S3 becomes YES and the program execution returns to the main routine. If the values are unequal, the pulse rate in pulse memory 106B is adjusted to the value corresponding to the exposure level stored in the exposure level memory 106A, in step S4.

Figure 4:
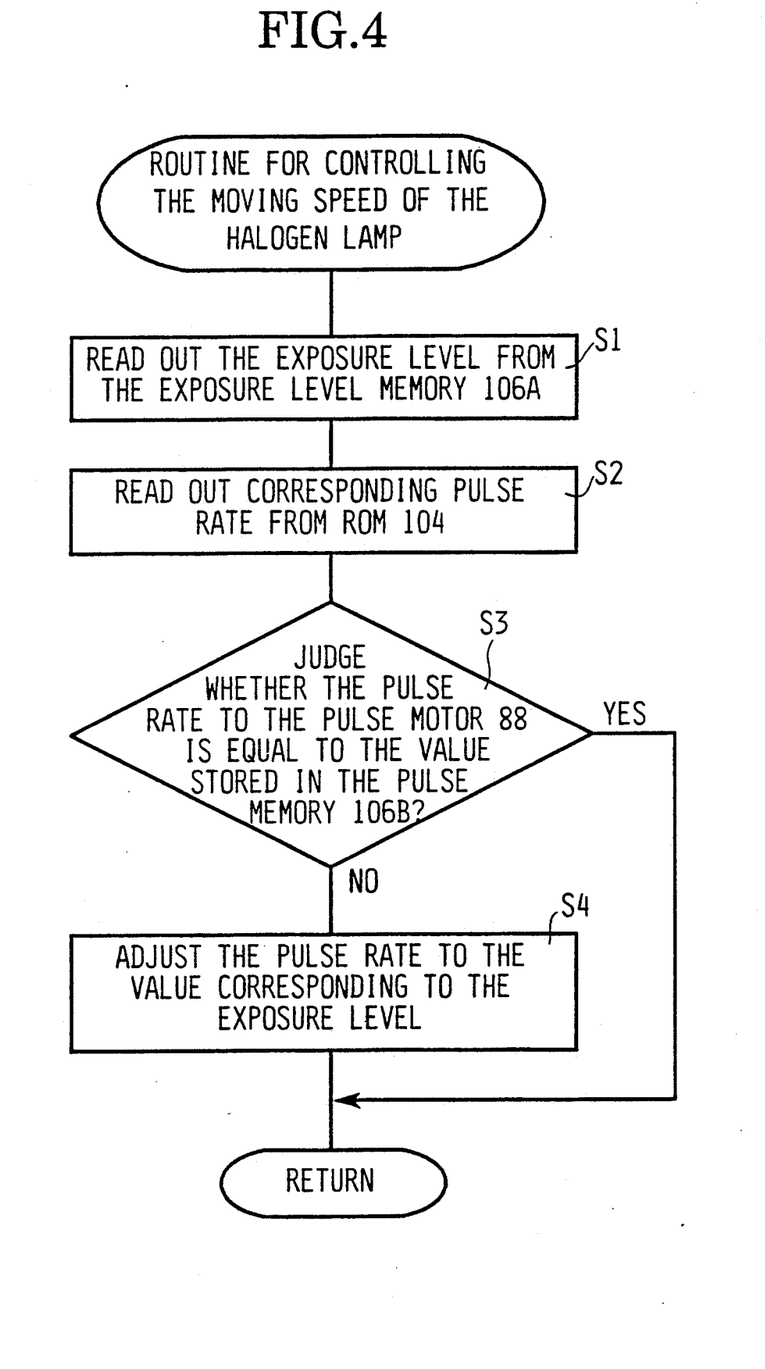
FIG. 4 is a flowchart showing a program for controlling the halogen lamp moving speed stored in the ROM of the computer.
Figure 5:
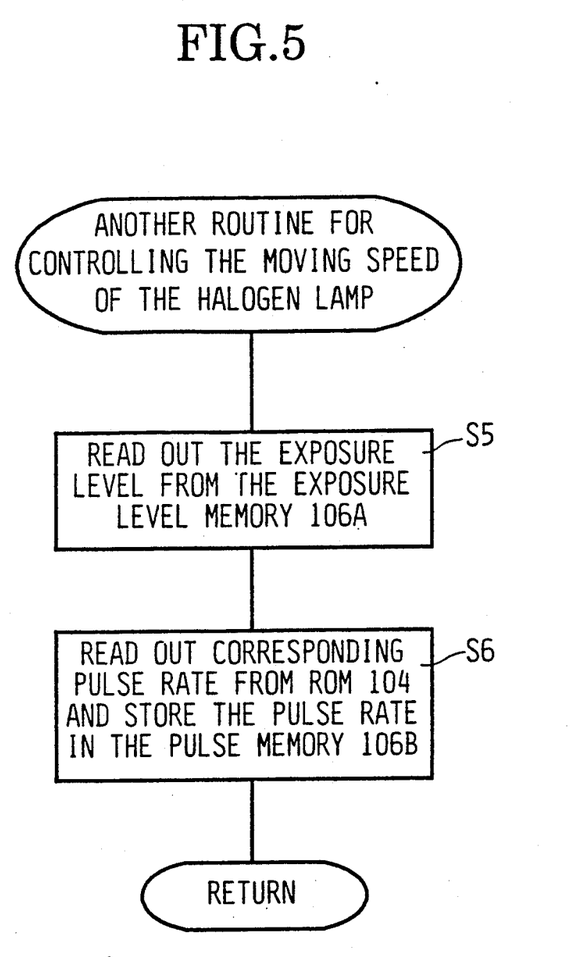
FIG. 5 is a flow chart showing a further simplified program for controlling the halogen lamp moving speed.

FIG. 5 shows an alternative simplified control scheme; wherein S5 corresponds to S1 in FIG. 4 and in S6 the pulse rate is read out from the ROM 104 as in S2. However, for simplicity, the read out pulse rate is stored in the pulse memory 106B without first checking to see if the correct value was already stored.

After the original text 12 has been set and the start key has been pressed, the feed operation for the photosensitive, pressure-sensitive paper 22 commences, and the paper 22 is moved together with the original text 12 in the direction shown by an arrow A and stopped at the position which is immediately below the exposing device 32. After the halogen lamp 80 has been turned on and its light output has become stable, it is moved to the right as shown in the drawing and the photosensitive, pressure-sensitive paper 22 is exposed to the light. During this operation, the pulse motor 88 is driven at the pulse rate stored in the pulse memory 106B, and the halogen lamp 80 is moved at a speed at which the specified exposure level is attained. The photosensitive, pressure-sensitive paper 22 has microcapsules containing three types of photosensitive resins which harden by being exposed to the light.

The halogen lamp 80 has its emission light wavelength set to a certain range so that the photosensitive resins are responsive evenly to the light which has passed through the original text. Accordingly, the photosensitive, pressure-sensitive paper 22 is exposed at the necessary degree to the light having a wavelength which matches the reactivity of the composition of the paper. On completion of the exposing operation, the halogen lamp 80 is brought back to its home position and the photosensitive, pressure-sensitive paper 22 is rewound while being moved in the direction shown by an arrow B. At this time, the original text 12 is led by the gate 72 and evacuated into the text tray 76 by way of the guide 74. The photosensitive, pressure-sensitive paper 22 is rewound until the original text 12 is evacuated to the tray 76, and thereafter it is fed again. With the developing paper 46 being placed on the exposure surface of the paper 22, it is processed for pressing, developing, heating and fixing by the pressure development device 34, and the finished copy is delivered.

According to this embodiment, as it is obvious from the above explanation, the moving device is constituted by the pulleys 82 and 84, the wire 86, the pulse motor 88, the drive pulley 90, etc., and the movement control device is constituted by the memory areas of the ROM 104 for storing the steps S1–S3, and the section of the CPU 102 for executing these steps.

Although in the above embodiment the halogen lamp 80 is moved in the exposing operation, the arrangement may be modified such that the halogen lamp 80 is fixed to a position and the photosensitive, pressure-sensitive paper 22 and the original text 12 are moved. In this case, the feed speed of photosensitive, pressure-sensitive paper 22 etc. is controlled so as to attain the specified exposure levels.

A fluorescent lamp may be used for the light source, and the pulse motor may be replaced with a d.c. motor, an a.c. motor, or the like for moving the light source and the photosensitive, pressure-sensitive paper.

Moreover, although in the above embodiment the photosensitive medium is exposed to light which has passed through the original text, the present invention is also applicable to an image recording apparatus which uses reflected exposure light, an apparatus for recording images on a recording medium having microcapsules and a coloring agent, an apparatus for recording images by using a medium on which images are recorded only through the exposure to the light, and image recording apparatus other than the copy machine.

While the present invention has been described and shown in terms of a specific embodiment, it will be obvious to those skilled in the art that changes and modifications may be made thereto without departing from the invention in its broader aspects.

What is claimed is:

1. An image recording apparatus with an exposing device having a light source for exposing a photosensitive medium, comprising:
   a relative moving means for producing relative movement between the light source and the photosensitive medium; and
   a control means for varying a speed of the relative movement in a plurality of steps in response to a predetermined exposing level, whereby an exposing level of the photosensitive medium by the light source is controlled by the control means.

2. An image recording apparatus according claim 1, wherein the relative moving means includes a light source moving device for moving the light source relatively to the photosensitive medium and the relative movement between them is produced by the light source moving device.

3. An image recording apparatus according to claim 2, wherein the light source is a halogen lamp.

4. An image recording apparatus according to claim 2, wherein the light source moving device comprises:
   a pair of pulleys;
   a line laid between the pulleys, said line carrying the light source; and
   a drive motor for driving the line reciprocatively.

5. An image recording apparatus according to claim 3, wherein the light source moving device comprises:
   a pair of pulleys;
   a wire laid between the pulleys, both ends thereof being connected to the halogen lamp; and
   a drive motor for driving the wire reciprocatively.

6. An apparatus for adjusting an exposing level of a photosensitive medium by a light source, comprising:
   a relative moving means for producing relative movement between the photosensitive medium and the light source;
   a control means for varying a speed of the relative movement in response to a predetermined exposing level, whereby an exposing level of the photosensitive medium by the light source is adjusted by the control means;
   wherein the control means includes a first memory means for storing the predetermined exposing level, the relative movement being controllable based on the predetermined exposing level stored in the first memory means; and
   an input means for inputting an exposing level, whereby an exposing level other than the predetermined exposing level is inputtable into the first memory means by the input means.

7. An adjusting apparatus according to claim 6, wherein the input means comprises an input panel and the other exposing level is manually inputtable into the first memory means by the input panel.

8. An adjusting apparatus according to claim 6, wherein the control means further includes a second memory means for storing a speed of the relative movement produced by the relative moving means and controls the relative moving means based on the speed stored in the second memory means.

9. An adjusting apparatus according to claim 8, further comprising an input means for inputting an exposing level and wherein an exposing level other than the predetermined exposing level is inputtable into the first memory means by the input means and the second memory means is capable of storing another speed of the relative movement corresponding to the other exposing level stored in the first memory means.

10. An adjusting apparatus according to claim 9, the control means further comprising:
   an operation means for determining the speed of the relative movement based on the exposing level inputted into the first memory means through the input means;
   a judging means for judging whether or not the determined speed coincides with the speed of the relative movement stored in the second memory means;
   wherein the control means controls the relative movement based on a judgment result of the judgment means.

11. An adjusting apparatus according to claim 10, wherein the control means controls the relative moving means in accordance with the speed stored in the second memory means when the judging means judges that the determined speed coincides with the speed stored in the second memory means and adjusts the speed in the second memory means to the speed corresponding to the exposing level stored in the first memory means when the judging means judges that the determined speed does not coincide with the speed stored in the second memory means.

12. An adjusting apparatus according to claim 11, wherein the relative moving means is a pulse motor, the second memory means stores a pulse rate for driving the pulse motor, the operation means determines the pulse rate based on the exposing level stored in the first memory means, the judging means judges whether or not the determined pulse rate coincides with the pulse rate stored in the second memory means, and the control means controls the pulse motor based on the pulse rate stored in the second memory means when the judging means judges that the determined pulse rate coincides with the pulse rate stored in the second memory means and adjusts the pulse rate stored in the second memory means to the pulse rate corresponding to the exposing level stored in the first memory means when the judging means judges that the determined pulse rate does not coincide with the pulse rate stored in the second memory means.

13. An adjusting apparatus according to claim 8, wherein the control means includes a table which relates multi-step values of exposing level to the speed of the relative movement necessary for attaining the respective exposing levels and wherein the control means reads out the exposing level from the first memory, determines the speed of the relative movement corresponding to the read out exposing level based on the table and stores the determined speed into the second memory means.

14. An image recording apparatus comprising:
  a feeding means for feeding an original text in a feed direction to an exposing position;
  a feeding and winding means for feeding a continuous photosensitive medium in the feed direction to the exposing position and for winding the medium passing through the exposing position in a rewind direction opposite to the feed direction; and
  an exposing means with a light source for irradiating light upon the original text and the photosensitive medium, wherein the original text feeding means has a gate means upstream of the exposing position, and the gate means guides the original text to the exposing position when feeding the original text in the feed direction by the original text feeding means and discharges the original text when rewinding the photosensitive medium in the rewind direction by the feeding and rewinding means.

15. An image recording apparatus according to claim 14, further comprising:
  a relative moving means for producing relative movement between the light source and the photosensitive medium; and
  a control means for controlling a speed of the relative movement, whereby an exposing level of the photosensitive medium by the light source is controlled by the control means.

16. An image recording apparatus according to claim 15, wherein the relative moving means produces the relative movement between the light source and the photosensitive medium by moving the light source relatively to the medium.

17. An image recording apparatus according to claim 16, further comprising a reflector means downstream of the light source in a moving direction of the light source.

18. An image recording apparatus with an exposing device having a light source for exposing a photosensitive medium, comprising:
  a relative moving means for producing relative movement between the light source and the photosensitive medium, the relative moving means including a light source moving device for moving the light source relative to the photosensitive medium and the relative movement between them being produced by the light source moving device; and
  a control means for varying a speed of the relative movement in response to a predetermined exposing level, whereby an exposing level of the photosensitive medium by the light source is controlled by the control means.

19. An apparatus for adjusting an exposing level of a photosensitive medium by a light source, comprising:
  a relative moving means for producing relative movement between the photosensitive medium and the light source;
  a control means for varying a speed of the relative movement in response to a predetermined exposing level, whereby an exposing level of the photosensitive medium by the light source is adjusted by the control means, the control means including a first memory means for storing the predetermined exposing level, the relative movement being controllable based on the predetermined exposing level stored in the first memory means, and a second memory means for storing a speed of the relative movement produced by the relative moving means and controlling the relative moving means based on the speed stored in the second memory means; and
  an input means for inputting an exposing level, wherein an exposing level other than the predetermined exposing level is inputtable into the first memory means by the input means and the second memory means is capable of storing another speed of the relative movement corresponding to the other exposing level stored in the first memory means.

20. An apparatus for adjusting an exposing level of a photosensitive medium by a light source, comprising:
  a relative moving means for producing relative movement between the photosensitive medium and the light source; and
  a control means for varying a speed of the relative movement in response to a predetermined exposing level, whereby an exposing level of the photosensitive medium by the light source is adjusted by the control means, the control means including a first memory means for storing the predetermined exposing level, the relative movement being controllable based on the predetermined exposing level stored in the first memory means, and a second memory means for storing a speed of the relative movement produced by the relative moving means and controlling the relative moving means based on the speed stored in the second memory means, and a table which relates multi-step values of exposing level to the speed of the relative movement necessary for attaining the respective exposing levels, wherein the control means reads out the exposing level from the first memory, determines the speed of the relative movement corresponding to the read out exposing level based on the table and stores the determined speed into the second memory means.

* * * * *